US008226795B2

(12) United States Patent
Brass et al.

(10) Patent No.: US 8,226,795 B2
(45) Date of Patent: Jul. 24, 2012

(54) MAGNETIC CLIPS AND SUBSTRATE HOLDERS FOR USE IN A PLASMA PROCESSING SYSTEM

(75) Inventors: William J. Brass, Largo, FL (US); Louis Fierro, Clearwater, FL (US); James D. Getty, Vacaville, CA (US)

(73) Assignee: Nordson Corporation, Westlake, OH (US)

( * ) Notice: Subject to any disclaimer, the term of this patent is extended or adjusted under 35 U.S.C. 154(b) by 725 days.

(21) Appl. No.: 12/364,888

(22) Filed: Feb. 3, 2009

(65) Prior Publication Data
US 2010/0194505 A1 Aug. 5, 2010

(51) Int. Cl.
*H01F 7/20* (2006.01)
(52) U.S. Cl. .................. 156/345.51; 335/285; 335/286
(58) Field of Classification Search .................. 335/285, 335/286; 156/345.51
See application file for complete search history.

(56) References Cited

U.S. PATENT DOCUMENTS

| 4,223,048 A | 9/1980 | Engle |
| 4,264,393 A | 4/1981 | Gorin |
| 4,282,077 A | 8/1981 | Reavill |
| 4,328,081 A | 5/1982 | Fazlin |
| 4,425,210 A | 1/1984 | Fazlin |
| 4,474,659 A | 10/1984 | Fazlin |
| 4,527,311 A * | 7/1985 | Aoki ............................ 24/303 |
| 4,623,441 A | 11/1986 | Fazlin |
| 4,681,649 A | 7/1987 | Fazlin |
| 4,689,105 A | 8/1987 | Fazlin |
| 4,806,225 A | 2/1989 | Fazlin |
| 4,859,271 A | 8/1989 | Fazlin |
| 4,863,577 A | 9/1989 | Fazlin |
| 5,280,156 A | 1/1994 | Niori et al. |
| 5,783,981 A * | 7/1998 | Abboud et al. ............... 335/284 |
| 5,795,452 A | 8/1998 | Kinoshita et al. |
| 6,009,890 A | 1/2000 | Kaneko et al. |
| 6,321,680 B2 | 11/2001 | Cook |
| 2003/0184234 A1 | 10/2003 | Hsu et al. |
| 2006/0163201 A1 | 7/2006 | Getty |

FOREIGN PATENT DOCUMENTS
DE 156715 A 9/1982
(Continued)

OTHER PUBLICATIONS

European Patent Office, International Search Report in Corresponding PCT/US2004/032973, Dec. 15, 2005 (18 pages).

(Continued)

*Primary Examiner* — Sylvia R. MacArthur
(74) *Attorney, Agent, or Firm* — Wood, Herron & Evans, LLP

(57) ABSTRACT

Magnetic clips for use with a substrate holder for holding a substrate in a processing chamber of a plasma treatment system. The clip includes first and second body members each having a clamping surface and a magnet. The first body member is configured to be mechanically connected with the substrate holder. The second body member is pivotally connected by a hinge with the first body member for movement relative to the first body member between closed and opened positions. In the closed position, an edge region of the substrate is positioned between the clamping surfaces. In the opened position, the edge region is released. The magnet on the second body member magnetically attracts the magnet on the first body member, when the second body member is in the closed position, to apply a force that restrains movement of the edge region of the substrate relative to the clamping surfaces.

20 Claims, 8 Drawing Sheets

FOREIGN PATENT DOCUMENTS

| | | |
|---|---|---|
| EP | 0359567 A2 | 3/1990 |
| JP | 60123032 A | 7/1985 |
| JP | 9123636 A | 8/1997 |

OTHER PUBLICATIONS

The International Bureau of WIPO, International Preliminary Report on Patentability in Corresponding PCT/US2004/032973, May 1, 2006 (11 pages).

US Patent and Trademark Office, Office Action issued in related U.S. Appl. No. 11/278,483 dated Jul. 17, 2008.

March, A Nordson Company, "PROVIA Plasma System", product brochure 2007 (2 pages).

March, A Nordson Company, "PCB Series Plasma Treatment System" product brochure 2004 (2 pages).

US Patent and Trademark Office, Office Action issued in related U.S. Appl. No. 11/278,483 dated Jan. 2, 2009.

\* cited by examiner

MAGNETIC CLIPS AND SUBSTRATE HOLDERS FOR USE IN A PLASMA PROCESSING SYSTEM

BACKGROUND

The invention relates generally to plasma processing systems, and more particularly to magnetic clips and substrate holders for use with a plasma processing system.

Plasma treatment is often used to modify the surface properties of substrates used in diverse applications relating to integrated circuits, electronic packages, and printed circuit boards. In particular, plasma treatment may be used in electronics packaging, for example, to etch resin, remove drill smear, increase surface activation and/or surface cleanliness for eliminating delamination and bond failures, improving wire bond strength, ensuring void free underfilling of chips on circuit boards, removing oxides, enhancing die attach, and improving adhesion for die encapsulation.

Typically, one or more substrates are placed in a plasma treatment system and a surface of each substrate is exposed to generated plasma species. The outermost surface layers of atoms are removed by physical sputtering, chemically-assisted sputtering, and chemical reactions promoted by the plasma. The physical or chemical action may be used to condition the surface to improve properties such as adhesion, to selectively remove an extraneous surface layer, or to clean undesired contaminants from the substrate's surface.

Conventional batch plasma treatment systems exist in which both sides of multiple large panels of material are plasma treated. Each of the panels is held by a substrate holder with a vertical orientation between a pair of planar vertical electrodes, which are energized with a suitable atmosphere present in the treatment chamber of the treatment system to generate a plasma. In such plasma treatment systems, conventional substrate holders well-suited for holding one or more substrates between the planar electrodes may be unable to effectively support thin printed circuit board material. These thin substrates, which are not rigid enough to be self-supporting, can move relative to the rack and may potentially short to one of the adjacent electrodes because of the inability of conventional substrate holders to lend rigid support to these sheets of flexible material. When a thin substrate shorts or touches an electrode, the substrate may be delaminated or otherwise damaged.

There is thus a need for a substrate holder that can rigidly support one or more thin panels or substrates during a plasma treatment process and allow the panels or substrates to be simultaneously treated on both sides at the same time.

SUMMARY OF THE INVENTION

The embodiments of the invention address these and other problems by providing magnetic clips for a substrate holder that are configured to rigidly support thin and flexible panels and substrates. The magnetic clips extend the capabilities of the substrate holder, which is also configured to hold thicker, more rigid panels and substrates. The clips and substrate holder may be used in a plasma treatment system that includes a processing space, a vacuum port for evacuating the processing space, a gas port for inducing a process gas into the processing space, and a plurality of electrodes. The electrodes are energized to generate a plasma, which then interacts with the substrates on the substrate holder. Plasma treatment can be used for etching, cleaning, surface activation, or any other surface modification necessary before the substrates are used in applications apparent to a person skilled in the art.

In one embodiment, a magnetic clip is provided for use with a substrate holder to hold an edge of a substrate in a plasma processing system. The clip includes a first body member configured to be mechanically coupled with the substrate holder, a hinge having a first portion mechanically connected with the first body member and a second portion pivotally connected to the first portion, and a second body member mechanically connected with the second portion of the hinge. The first body member includes a first clamping surface and a first magnet. Similarly, the second body member includes a second clamping surface and a second magnet. The second body member is mechanically connected with the second portion of the hinge for pivotal movement relative to the first body member between a closed position in which the edge of the substrate is positioned between the first and second clamping surfaces in a contacting relationship and an opened position in which the edge of the substrate is released. In the closed position, the edge of the substrate is located between the first and second clamping surfaces. In the opened position, the edge of the substrate is released. The second magnet is configured to magnetically attract the first magnet, when the second body member is in the closed position, to apply a force that restrains movement of the edge of the substrate relative to the first and second clamping surfaces.

In another embodiment, a substrate holder is provided for holding a substrate in a processing system. The substrate holder includes a frame member having a plurality of frame elements and a window for the substrate disposed peripherally inside the frame elements. A magnetic clip, with a construction as described hereinabove, is attached to one of the frame elements.

BRIEF DESCRIPTION OF THE FIGURES

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1:
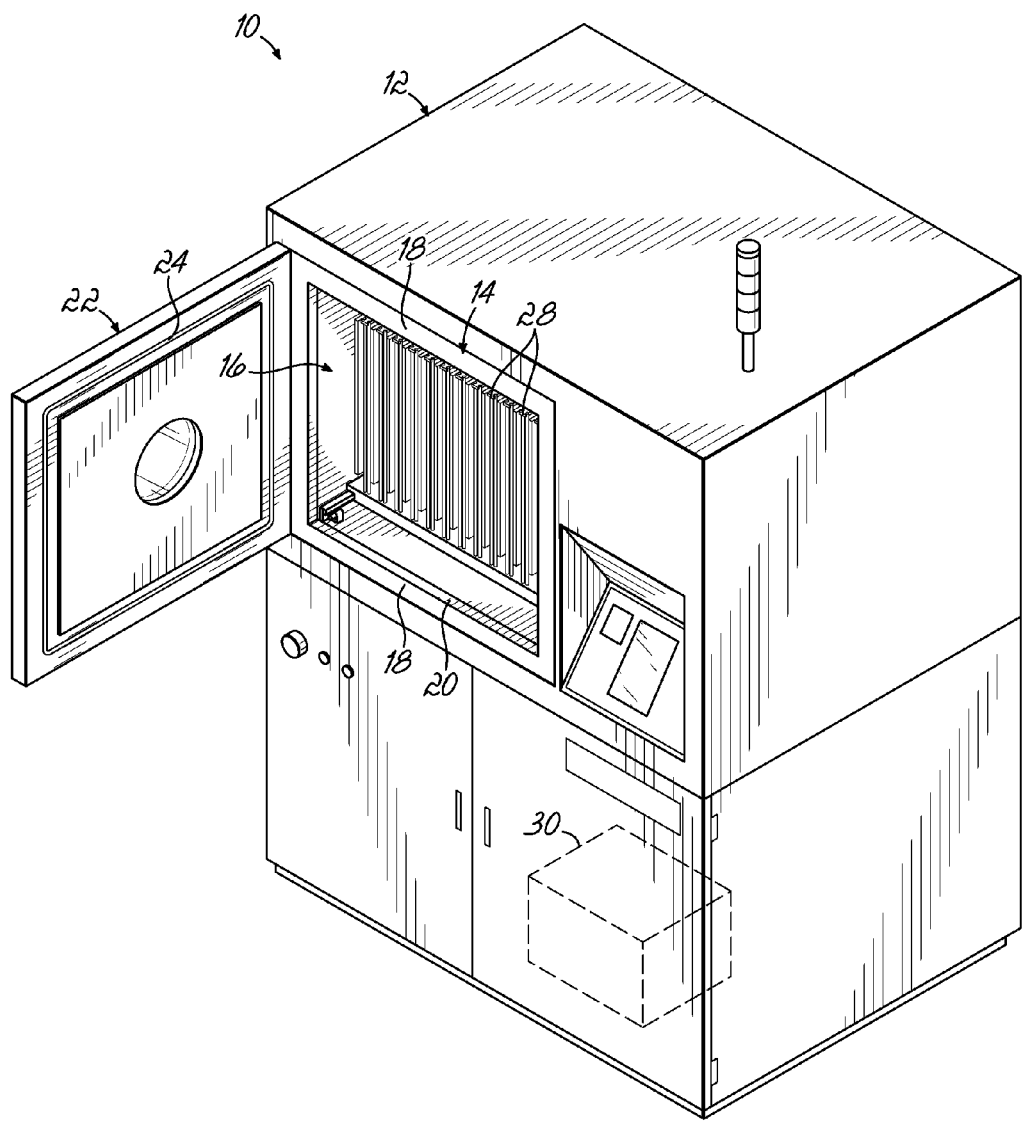
FIG. 1 is a front perspective view of a multiple-electrode plasma treatment system that integrates a rack of substrate holders.

With reference to FIG. 1, a plasma treatment system generally indicated by reference numeral 10 includes a cabinet or enclosure 12, a vacuum chamber 14, and an evacuable space 16 surrounded by sidewalls 18 of the vacuum chamber 14. The evacuable space 16 is accessed through an access opening 20 in the vacuum chamber 14. A chamber door 22 can be opened to reveal access opening 20, through which the evacuable space 16 is accessed, and closed to supply a fluid-tight seal that isolates the evacuable space 16 from the surrounding ambient environment. The chamber door 22, which is attached adjacent to the access opening 20 by hinges positioned along one side edge of the vacuum chamber 14, carries a latch that engages another portion of the vacuum chamber 14 when the chamber door 22 is in the closed position. A sealing member 24, which encircles the periphery of the chamber door 22, promotes a sealed engagement of the chamber door 22 with the access opening 20. The vacuum chamber 14 is formed of an electrically conductive material suitable for high-vacuum applications, such as an aluminum alloy or stainless steel, and is connected with electrical ground.

As described more fully in U.S. patent application Ser. No. 12/123,954, filed on May 20, 2008, the disclosure of which is incorporated by reference herein in its entirety, the evacuable space 16 defined inside the vacuum chamber 14 is evacuated through a pump port (not shown) penetrating through one sidewall 18 of the vacuum chamber 14 by a vacuum pumping system (not shown). The vacuum pumping system, which may be located inside the enclosure 12 or on the floorspace adjacent to the enclosure 12, is connected with the pump port by a vacuum line. The vacuum pumping system may comprise one or more vacuum pumps having a construction and operation recognized by a person of ordinary skill in the art of vacuum technology. For example, the vacuum pumping system may include a rotary vane pump and roots blower that cooperate to establish and maintain a vacuum pressure within the vacuum chamber 14 that is in the low mTorr range. During processing, the vacuum chamber 14 may be evacuated to, for example, a vacuum pressure in the range of about 200 mTorr to about 300 mTorr. The vacuum pumping system is used to evacuate atmospheric gases from the evacuable space 16 each time that space 16 is vented for a panel exchange.

The plasma treatment system 10 includes a plurality of electrodes 28, which are nominally identical, located inside the vacuum chamber 14 and a plasma excitation source, such as a radio-frequency (RF) generator 30. The electrodes 28 are electrically connected in parallel with the RF generator 30 and the vacuum chamber 14 serves as an unpowered, grounded counterelectrode. The RF generator 30 includes an impedance matching device and an RF power supply operating at a frequency of, for example, about 40 kHz, although other operating frequencies in the kHz to MHz range may be used. The power supplied to the electrodes 28 may range from about 4000 watts to about 8000 watts at 40 kHz. However, a person having ordinary skill in the art will appreciate that the system 10 may be modified to permit the delivery of different bias powers or, alternatively, may permit the utilization of a direct current (DC) power supply.

The electrodes 28 are suspended in a juxtaposed relationship from one of the sidewalls 18 of the vacuum chamber 14. An individualized process chamber or cell is defined by the space between each adjacent pair of juxtaposed electrodes 28. The electrodes 28 have the representative form of solid metal plates that are, for example, about 0.5 inch (about 1.3 centimeter) thick and a rectangular geometrical shape. The metal forming electrodes 28, such as aluminum or an aluminum alloy, is characterized by a relatively high electrical conductivity and a relatively high thermal conductivity to promote efficient heat transfer.

Figure 2:
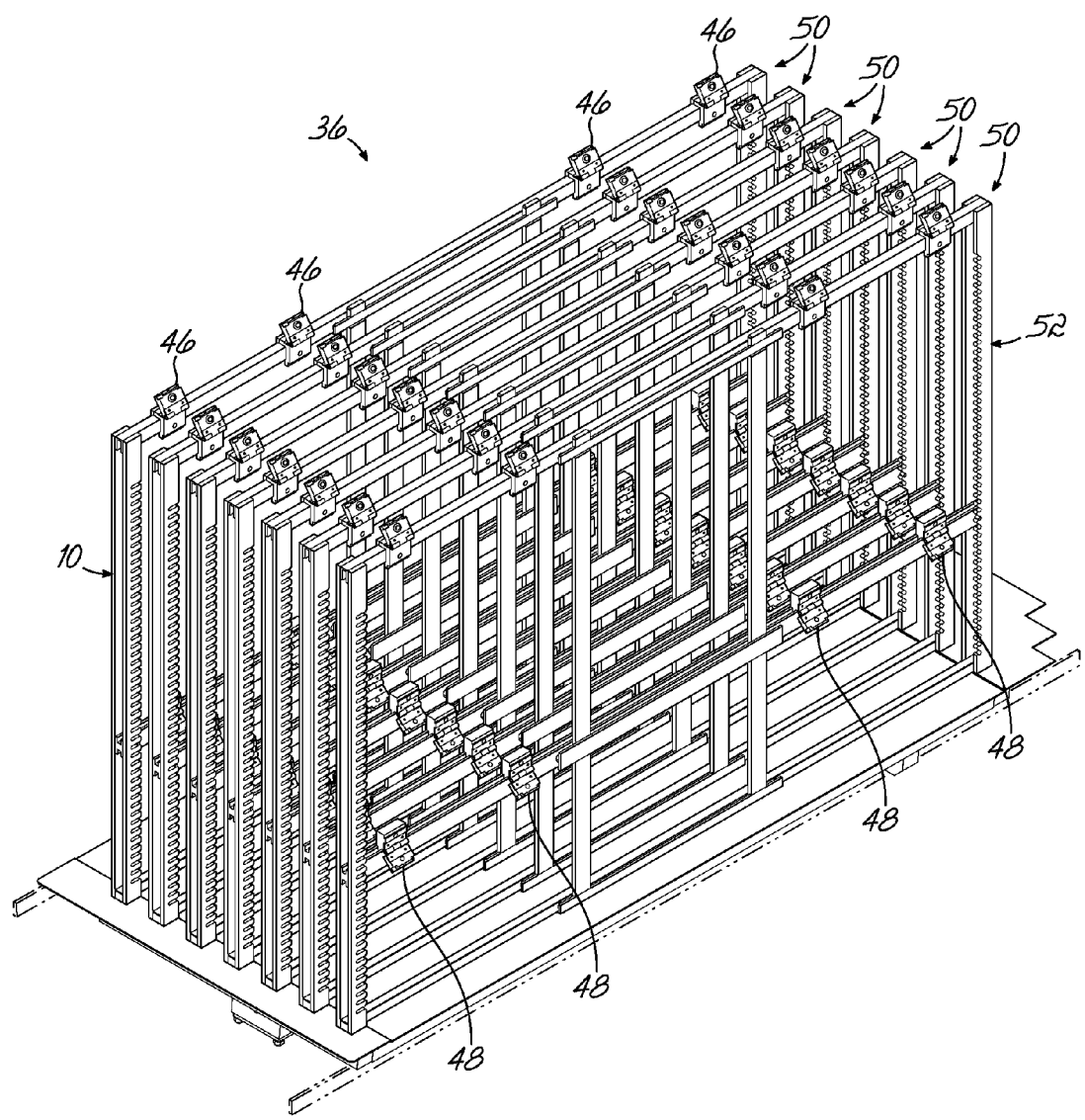
FIG. 2 is a perspective view of the rack of substrate holders that is used to hold the panels at treatment positions in the process chambers inside the multiple-electrode plasma treatment system and with multiple upper and lower clips depicted in an opened condition.
Figure 3:
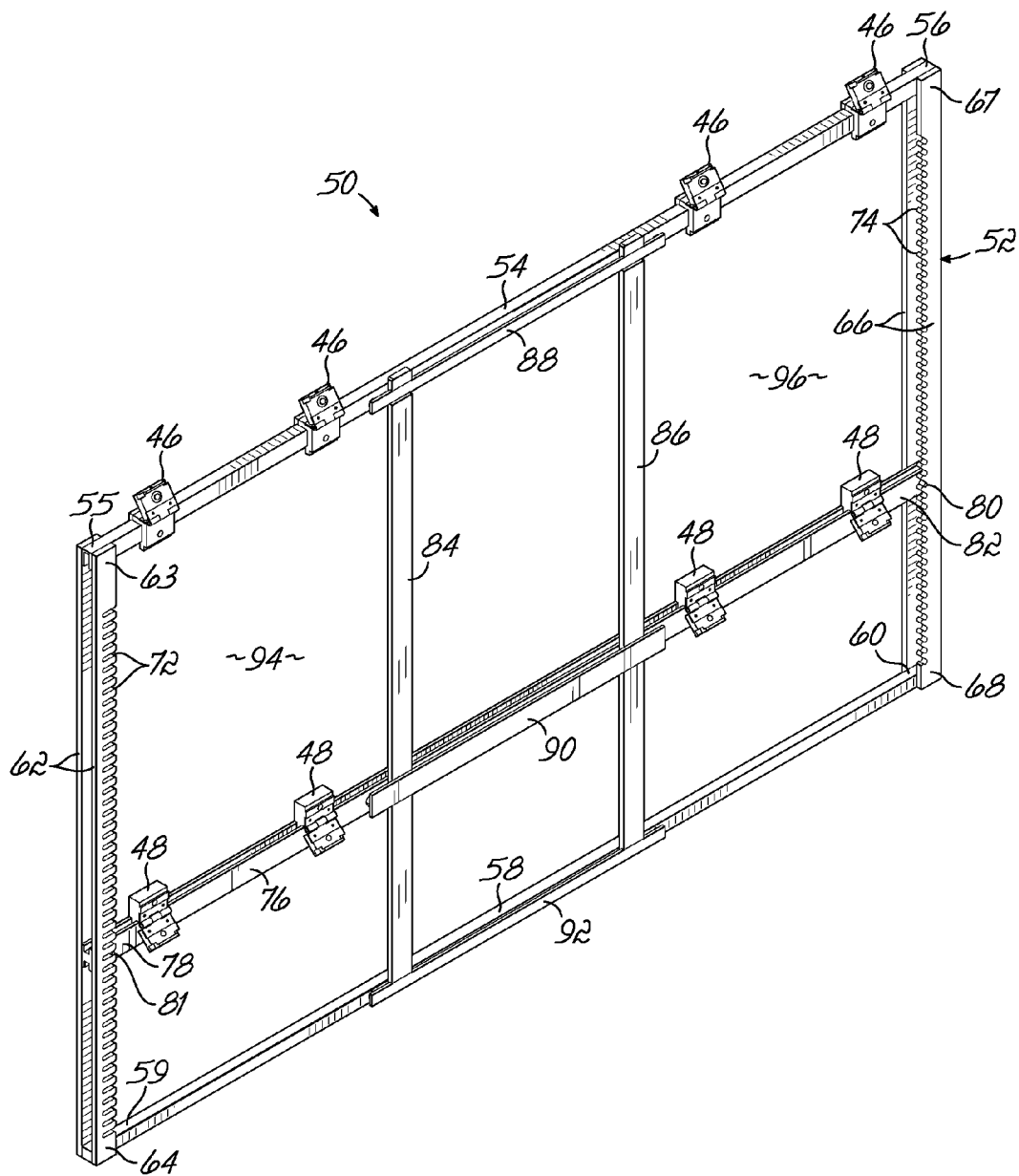
FIG. 3 is a detailed view of one of the substrate holders of the rack in FIG. 2 with the upper and lower clips in an opened condition.

As best shown in FIG. 2, the plasma treatment system 10 includes a rack 36 equipped with multiple product or substrate holders 50, which are nominally identical, configured to support products in representative form of substrates or panels 40 (FIGS. 8-10) inside the vacuum chamber 14. Each of the substrate holders 50 is configured to support one or more of the panels 40. After the rack 36 is populated with a lot or batch of panels 40, the chamber door 22 is opened and the rack 36 is transferred into the vacuum chamber 14. Following the transfer, the rack 36 is positioned inside the vacuum chamber 14 so the chamber door 22 can be closed to provide a sealed environment ready for evacuation by the vacuum pumping system.

In use, the substrate holders 50 of the rack 36 are populated with panels 40 at a location outside of the vacuum chamber 14, the vacuum chamber 14 is vented to atmospheric pressure, the chamber door 22 is opened to reveal the access opening 20, and the rack 36 is transferred through the access opening 20 into the vacuum chamber 14. The access opening 20 is sealed by closing chamber door 22 and engaging the latch. Each of panels 40 is supported by one of the substrate holders 50 between an adjacent pair of the electrodes 28.

Atmospheric gases resident in the evacuable space 16 inside the vacuum chamber 14 are evacuated using the vacuum pumping system. A flow of a source gas is supplied to a gas distribution manifold from the source gas supply (not shown) and with a mass flow rate metered by the mass flow controller (not shown), while actively evacuating the vacuum chamber 14 with vacuum pumping system. The source gas is injected from gas delivery tubes into the space between each adjacent pair of electrodes 28.

Once a desired process pressure is achieved and stabilized inside the vacuum chamber 14, the RF generator 30 is energized to supply electrical power to the electrodes 28. Electrical power is delivered by conductive members to a location inside each solid electrode 28. The source gas resident between each adjacent pair of electrodes 28 is partially ionized by the applied RF energy to generate plasma locally in each of the process cells. The plasma inside each of the process cells represents partially ionized source gas consisting of ions, electrons, free radicals, and neutral species.

The panels 40 are exposed to the plasma in the process cells for a duration sufficient to treat the exposed opposite surfaces of each panel 40. The ionized gas mixture constituting the plasma is conductive and highly reactive, which promotes the plasma's ability to interact with the panels 40 to perform the prescribed plasma treatment. Plasma-generated active species perform physical processes through ion bombardment and chemical processes through radical/byproduct chemical reactions. Contingent upon the particular source gas or combination of source gases, a different reaction can be caused to occur on the panel surfaces. The process recipe may be varied according to the nature of the plasma treatment. For printed circuit board applications, chemical reactions at the surfaces of the panels 40 are utilized to remove drill smear and resist scum and to increase wettability for laminating and legend adhesion. After the treatment is completed, the chamber door 22 is opened to reveal the access opening 20, the rack 36 carrying the processed panels 40 is removed from the vacuum chamber 14, and the processed panels 40 are offloaded from the rack 36 and routed to another processing stage. Additional details of exemplary plasma treatment systems 10 are disclosed more fully in U.S. patent application Ser. No. 12/123, 954 identified above, and U.S. Patent Publication No. 2006/0163201, the disclosure of which is incorporated by reference herein in its entirety.

With reference to FIGS. 3-7, each substrate holder 50 includes a plurality of upper magnetic clips 46 and a plurality of lower magnetic clips 48 that are constructed in accordance with an embodiment of the invention and that is used in conjunction with plasma treatment system 10 for treating panels 40 with plasma, as described above. Although the clips 46, 48 and substrate holder 50 will be described herein with reference to a plasma treatment system 10, the clips 46, 48 and substrate holder 50 are not limited to use in conjunction with this representative plasma processing system 10, but instead may be used with other plasma processing systems and other types of processing systems as understood by a person having ordinary skill in the art.

As shown in these figures, each substrate holder 50 further includes a frame member 52 having a generally rectangular structure constructed of bars or rods made out of a metal, such as aluminum. More specifically, the frame member 52 includes an upper rail or frame element 54 with a first end 55 and a second end 56; a lower rail or frame element 58 with a first end 59 and a second end 60; a first side rail or frame element 62 with a first end 63 coupled to the first end 55 of the upper frame element 54 to define a corner and a second end 64 coupled to the first end 55 of the lower frame element 58 to define another corner; and a second side rail or frame element 66 with a first end 67 coupled to the second end 56 of the upper frame element 54 to define a corner and a second end 68 coupled to the second end 60 of the lower frame element 58 to define another corner. The frame elements 54, 58, 62, 66 define a closed shape and are fixed in position relative to each other. In the latter regard, the various frame elements 54, 58, 62, 66 may be coupled to each other by welding or any other known method of attachment to create the frame member 52.

When positioned within the processing space 16 of the vacuum chamber 14, the upper frame element 54 and the lower frame element 58 are generally horizontally oriented, and the side frame elements 62, 66 are generally vertically oriented. References herein to terms such as "vertical", "vertically", "horizontal", "horizontally", etc. are made by way of example, and not by way of limitation, to establish a frame of reference for purposes of description. It is understood various other frames of reference may be employed without departing from the spirit and scope of the invention.

Figure 4:
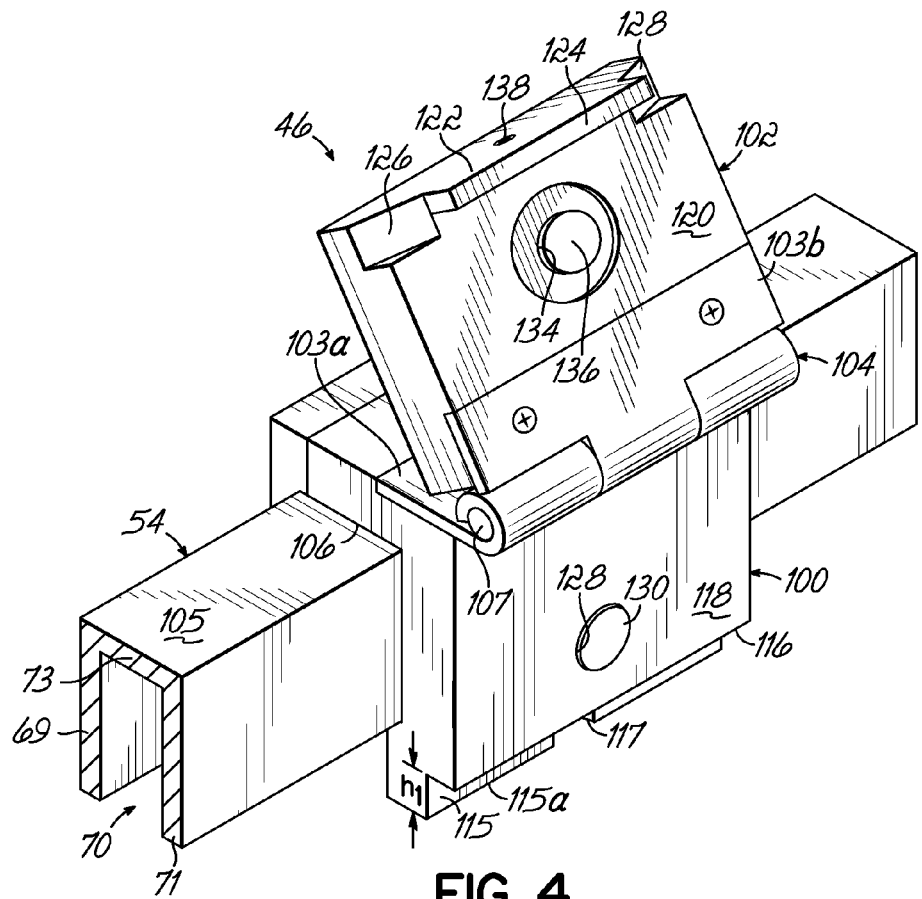
FIG. 4 is a detailed perspective view of one of the upper clips in FIGS. 2 and 3.

As illustrated in FIG. 4, the upper frame element 54 of the frame member 52 is fashioned as a U-shaped bar with legs 69, 71 joined by an intervening section 73 to define a channel 70 that faces downward toward the lower frame element 58. One structural element of the side frame element 62 includes generally horizontal slots 72 formed into a side thereof that faces or confronts the side frame element 66 and opens into the interior of the frame member 52. One structural element of the side frame element 66 similarly includes inclined or angled slots 74 formed into a side surface thereof that faces or confronts the side frame element 62 and opens into the interior of the frame member 52. Each of the horizontal slots 72 is approximately aligned with one of the angled slots 74.

In addition to the frame elements 54, 58, 62, 66, substrate holder 50 may include addition support structures to permit the support of one or more panels 40 therein. In this regard, substrate holder 50 includes a horizontal cross beam 76 that extends between the first and second side frame elements 62, 66, and is adapted to be generally parallel relative to the upper and lower frame elements 54, 58 when coupled thereto. The separation of the horizontal cross beam 76 from the upper frame element 54 is approximately equal to the lengths of the panels 40 that the substrate holder 50 is adapted to support. The horizontal cross beam 76 includes a first end 78, a second end 80, a first pin 81 located adjacent to first end 78, and a second pin 82 located adjacent to the second end 80. The first pin 81 is adapted to engage the horizontal slots 72 of the side frame element 62 and the second pin 82 is adapted to engage the angled slots 74 of the side frame element 66, to support horizontal cross beam 76 within the frame member 52.

The substrate holder 50 may include still further support structures for supporting one or more panels 40 therein. In this regard, substrate holder 50 includes at least one, and a plurality of vertical cross beams 84, 86 that extend between the upper and lower frame elements 54, 58 of the frame element 54, and that are adapted to be aligned generally parallel relative to the side frame elements 62, 66 with a generally vertical orientation when coupled to the substrate holder 50. The separation of the vertical cross beams 84, 86 from the nearest one of the side frame elements 62, 66 correlates to a width of the panels 40 that the substrate holder 50 is adapted to support. The presence of the vertical cross beams 84, 86 is optional as these structures may be omitted.

The vertical cross beams 84, 86 are secured with the upper and lower frame elements 54, 58 of the frame element 54 and the horizontal cross beam 76 by a plurality of generally planar support bars 88, 90, 92. Support bar 88 is attached to an outer surface of the upper frame element 54 with a spaced apart relationship to define a gap or channel between the support bar 88 and the upper frame element 54. Support bar 90 is attached to an outer surface of the horizontal cross beam 76 with a spaced apart relationship to define a gap or channel between the support bar 90 and the horizontal cross beam 76. The channels may extend for approximately the full length of the respective support bars 88, 90, 92 (but for the coupling to the upper frame element 54, the horizontal cross beam 76, and the lower frame element 58, respectively). The support bars 88, 90, 92 are located on the same side of the substrate holder 50 and the channels are approximately aligned with each other.

One end of each of the vertical cross beams 84, 86 resides in the channel defined between the support bar 88 and the outer surface of the upper frame element 54. An opposite end of each of the vertical cross beams 84, 86 resides in the channel defined between the support bar 92 and the outer surface of the lower frame element 58. An intermediate region of each of the vertical cross beams 84, 86 resides in the channel defined between the support bar 90 and the outer surface of the horizontal cross beam 76. The lateral position of the vertical cross beams 84, 86 can be continuously adjusted relative to the side frame elements 62, 66.

Similarly, the horizontal cross beam 76 may be moved in a generally vertical direction independent of the position of the vertical cross beams 84, 86. Because the horizontal cross beam 76 and the vertical cross beams 84, 86 are adapted to be independently movable relative to the frame member 52, generally planar panels 40 of various different dimensions may be supported in the substrate holder 50 by merely adjusting the location of the horizontal and vertical cross beams 76, 84, 86. The adjustment of the horizontal and vertical cross beams 76, 84, 86 define windows 94, 96, the sizes of which correlate with the dimensions of the panels 40 held by the substrate holder 50. The ability to independently move the vertical cross beams 84, 86 permits the substrate holder 50 to accommodate panels 40 (e.g., two such panels in the representative embodiment) with different widths and in the same substrate holder 50. The horizontal and vertical cross beams 76, 84, 86 effectively operate as additional frame elements of the frame member 52 that supplement the outer frame elements 54, 58, 62, 66 to conform the substrate holder 50 to the dimensions of the panels 40 being handled.

The vertical location of the horizontal cross beam 76 relative to upper frame element 54 defines another dimension for the windows 94, 96 that correlates to a length of the supported panels 40. The vertical location may be adjusted by sliding the pin 82 upwards out of its angled slot 74, pivoting the horizontal cross beam 76 at the pin 81, and sliding the pin 81 out of the horizontal slot 72 once enough clearance has been created by the pivoting motion. The horizontal cross beam 76 is then lifted or lowered vertically to a desired location relative to the upper frame element 54 and reinstalled by reversing these same actions described above to engage the pin 81 with a corresponding horizontal slot 72 and the pin 82 with a corresponding angled slot 74.

Figure 5:
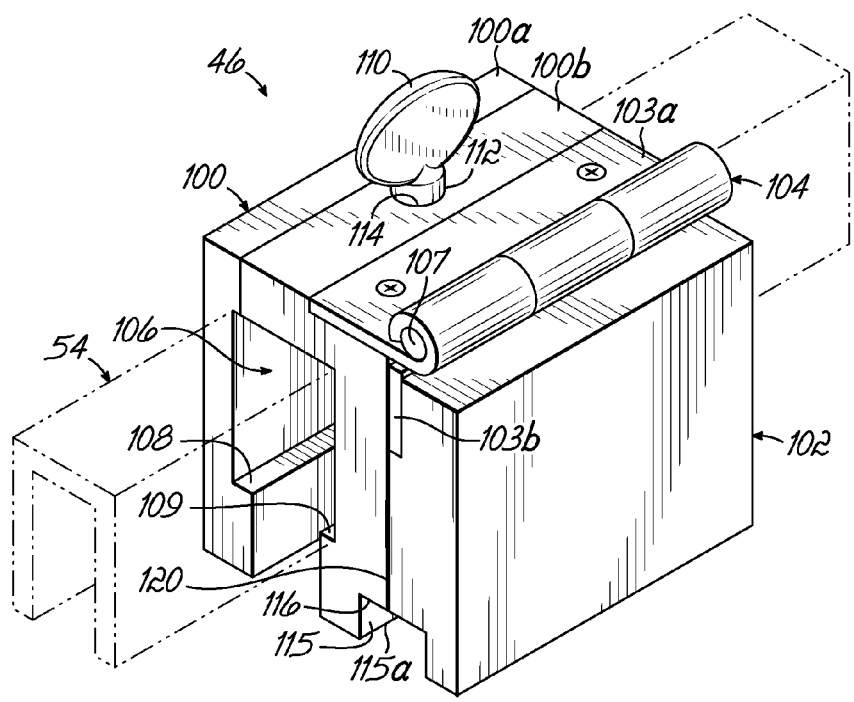
FIG. 5 is a view similar to FIG. 4 with the upper clip in a closed condition.
Figure 10:
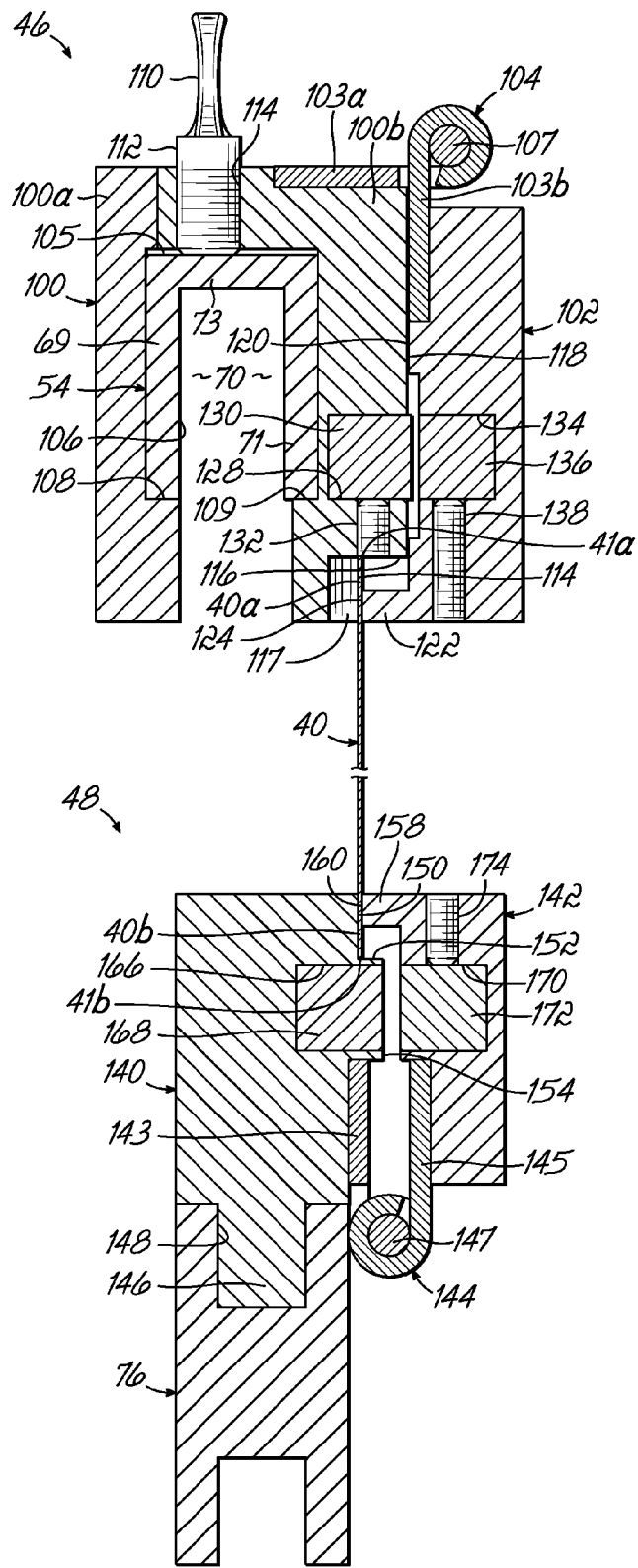
FIG. 10 is a cross-sectional view taken generally along line 10-10 in FIG. 9.

With particular reference to FIGS. 4, 5, and 10, each of the upper magnetic clips 46 includes a first body member 100, a second body member 102, and a hinge 104 that couples the first body member 100 with the second body member 102. The first and second body members 100, 102 may be composed of any suitable material, such as aluminum. For ease of assembly with the upper frame element 54, the body member 100 includes multiple sections 100a, 100b that are assembled together with conventional fasteners (not shown) to form an integral construction.

The first body member 100 is secured to an exterior surface 105 of the upper frame element 54. To that end, the first body member 100 includes a T-shaped channel 106 and the upper frame element 54 extends lengthwise through the T-shaped channel 106. A thumbscrew 110 includes a threaded shaft 112 that extends through a threaded opening 114 defined in the first body member 100. A tip of the threaded shaft 112 contacts the exterior surface 105 of the intervening section 73 of the frame member 52. As the thumbscrew 110 is tightened, the upper magnetic clip 46 moves vertically until the tips of the legs 69, 71 of the upper frame element 54 have a contacting relationships with ledges 108, 109, which project inwardly to give the channel 106 its T-shape with the head of the "T" above the ledges 108, 109 and the base of the "T" between the ledges 108, 109. These contacting relationships secure the upper magnetic clip 46 against horizontal movement along the length of the upper frame element 54 and establish a fixed position for the upper magnetic clip 46 along the length of the upper frame element 54 and between the side frame elements 62, 66. Conversely, the thumbscrew 110 can be loosened to permit horizontal movement of the upper magnetic clip 46 along the length of the upper frame element 54 to a different fixed position.

Along one side, the body member 100 of the upper magnetic clip 46 includes a stepped profile with a generally-planar clamping surface 115 and a generally-planar stop surface 116 that is oriented in a plane generally orthogonal to a plane containing the clamping surface 115. In the representative embodiment, the surfaces 115, 116 extend for the full width of the body member 100. Body member 100 further includes another generally planar surface 118 that is oriented in a plane that is generally parallel with the plane of the clamping surface 116. The clamping surface 116 includes an optional recess 117 that is described further below.

Along one side, the body member 102 includes a generally planar surface 120 and a flange 122 that projects outwardly from the surface 120. The flange 122 includes a clamping surface 124 that is contained in a plane that is generally parallel with a plane containing surface 120. The flange 122 is truncated at opposite ends by respective recesses 126, 128, which likewise truncate the clamping surface 124 so that the flange 122 and clamping surface 124 do not extend the full width of the body member 102. The recesses 126, 128 promote the ability to easily open the upper magnetic clip 46 by providing pressure points for the operator's finger tips.

Hinge member 104 includes a first portion 103a that is mechanically connected with conventional fasteners to the body member 100 and a second portion 103b that is mechanically connected with conventional fasteners to the body member 102. A hinge pin 107 couples the portions 103a, 103b together to permit body member 102 to pivot over a limited range of rotation relative to body member 100. Body members 100, 102 have respective recessed regions to which the portions 103a, 103b are fastened.

Body member 102 of the upper magnetic clip 46 pivots relative to the body member 100 about the hinge member 104 between a closed position in which the panel 40 is secured to the upper magnetic clip 46 and an opened position in which the panel 40 is released from the clip 46. In the closed position (FIGS. 5, 10), the panel 40 is captured or pinched between the clamping surfaces 115, 124 of the body members 100, 102. Because body member 100 is secured to the upper frame element 54, the clamped panel 40 has a fixed position relative to the frame member 52. In the closed position, the flange 122 has a clearance with the stop surface 116 and projects toward the clamping surface 115 on body member 100. Each of the recesses 126, 128 is dimensioned and shaped to provide access for application of an opening force to the body member 102 to move the second body member 102 from a closed position to an opened position.

In the opened position (FIG. 4), the body member 102 is pivoted past vertical (through an obtuse angle greater than 180°) to a position relative to body member 100 in which the body member 102 remains stationary in the absence of externally applied force. The body member 102 can be closed with a manual external force (e.g., using one hand) applied by an operator who is loading panels 40 into the substrate holder 50. In use, the stop surface 116 operates as a vertical hard stop for the panel 40 so that the panel 40 is not contacted by surfaces 118, 120 when the upper magnetic clip 46 is closed.

The body member 100 includes a blind cavity 129 that intersects the surface 118, a magnet 130 installed in the cavity 129, and a set screw 132 used to fix the position of the magnet 130 in the cavity 129. The optional recess 117 in clamping surface 115 provides clearance to access the head of the set screw 132. Similarly, body member 102 includes a blind cavity 134 that intersects the surface 120, a magnet 136 installed in the cavity 134, and a set screw 138 used to fix the position of the magnet 136 in the cavity 134. The lateral locations of the magnets 130, 136 on the respective surfaces 118, 120 are selected so that the magnets 130, 136 have a confronting relationship when the upper magnetic clip 46 is closed. The blind cavity 129 for magnet 130 is disposed between the portion 103a of hinge member 104 and the clamping surface 115 on body member 100. The cavity 134 for magnet 136 is disposed between the portion 103b of hinge member 104 and the flange 122 (and clamping surface 124) on body member 102.

The magnets 130, 136 cooperate to apply a clamping force arising from mutual magnetic attraction when brought into proximity as the body member 102 is moved relative to body member 100 to the closed position. The clamping force is transferred to the clamping surfaces 115, 124, which are separated by the thickness of a top edge region 40a of panel 40 and are therefore in an indirectly contacting relationship, so that the top edge region 40a of panel 40 is secured in a fixed position between the clamping surfaces 115, 124 and restrained against movement relative to the clamping surfaces 115, 124. The flange 122 projects outwardly from surface 120 by amount sufficient to accommodate the hinge 104, to permit the magnets 130, 136 to mutually attract each other to provide an adequate clamping force, and to permit the clamping surfaces 115, 124 to contact.

The magnets 130, 136 may be composed of any acceptable permanent magnet material that is not demagnetized by temperatures exceeding about 120° C. In one embodiment, the magnets 130, 136 are composed of a samarium/cobalt alloy which exhibits a high resistance to demagnetization and good temperature stability. The magnets 130, 136 may also be nickel-coated. The magnetic field strength of the magnets 130, 136 is chosen such that the plasma is not perturbed by their presence. Embedding the magnets 130, 136 within the material of the body members 100, 102 minimizes the plasma exposure.

Figure 6:
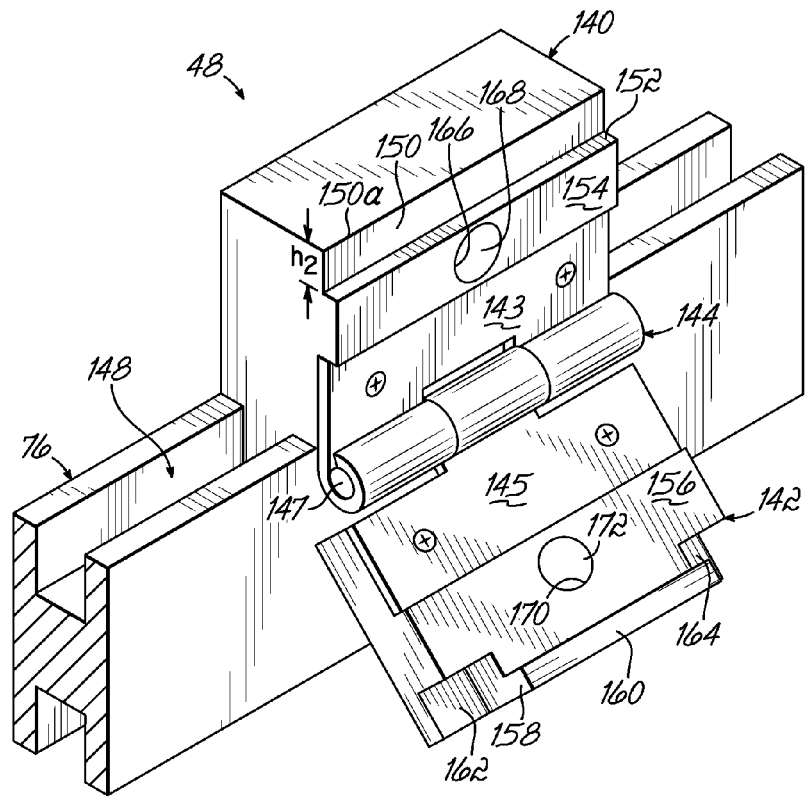
FIG. 6 is a detailed perspective view of one of the lower clips shown in FIGS. 2 and 3.
Figure 7:
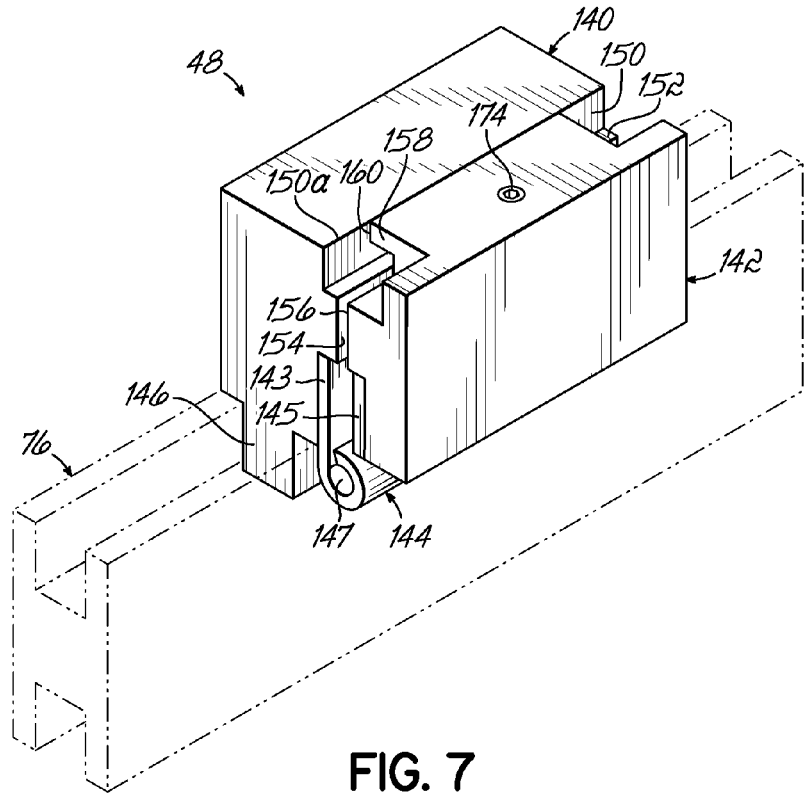
FIG. 7 is a view similar to FIG. 6 with the lower clip in a closed condition.

With particular reference to FIGS. 6, 7, and 10, each of the lower magnetic clips 48 includes a first body member 140, a second body member 142, and a hinge 144 that couples the first body member 140 with the second body member 142. The first and second body members 140, 142 may be composed of any suitable material, such as aluminum.

The first body member 140 is passively coupled with the horizontal cross beam 76. To that end, the first body member 140 includes a tang 146 that is inserted into a channel 148 running along the length of the horizontal cross beam 76, which has an H-shaped profile. Unlike the upper magnetic clips 46, the lower magnetic clips 48 are not configured to be fixed in lateral position relative to the side frame elements 62, 66. Instead, the tang 146 is merely located within the channel 148 to an extent sufficient to regulate uncontrolled movement relative to the horizontal cross beam 76.

Along one side, the body member 140 of the lower magnetic clip 48 includes a stepped profile with a generally-planar clamping surface 150 and a generally-planar stop surface 152 that is oriented in a plane generally orthogonal to a plane containing the clamping surface 150. In the representative embodiment, the surfaces 150, 152 extend for the full width of the body member 140. Body member 140 further includes another generally planar surface 154 that is oriented in a plane that generally parallel with the plane of the clamping surface 150.

Along one side, the body member 142, which is similar in construction to body member 102, includes a generally planar surface 156 and a flange 158 that projects outwardly from the surface 156. The flange 158 includes a clamping surface 160 that is contained in a plane that is generally parallel with a plane containing surface 156. The flange 158 is truncated at opposite ends by respective recesses 162, 164, which likewise truncate the clamping surface 160 so that the flange 158 and clamping surface 160 do not extend the full width of the body member 142. The recesses 162, 164 promote the ability to easily open the lower magnetic clip 48 by providing pressure points for the operator's finger tips. In the closed position, the flange 158 has a clearance with the stop surface 152 and projects toward the clamping surface 150 on body member 140.

Hinge member 144 includes a first portion 143 that is mechanically connected with conventional fasteners to the body member 140 and a second portion 145 that is mechanically connected with conventional fasteners to the body member 142. A hinge pin 147 couples the portions 143, 145 together to permit body member 142 to pivot over a limited range of rotation relative to body member 140. Body members 140, 142 have recessed regions to which the portions 143, 145 are fastened.

Body member 142 of the lower magnetic clip 48 pivots relative to the body member 140 about the hinge member 144 between a closed position in which the panel 40 is secured to the lower magnetic clip 48 and an opened position in which the panel 40 is released from the clip 48. In the closed position (FIGS. 7, 10), the panel 40 is captured or pinched between the clamping surfaces 150, 160 of the body members 140, 142. The body member 142 can be closed with a manual external force (e.g., using one hand) applied by an operator. Each of the recesses 162, 164 is dimensioned and shaped to provide access for application of an opening force to the body member 142 to move the second body member 142 from a closed position to an opened position. In use, the stop surface 152 operates as a vertical hard stop for the panel 40 so that the panel 40 is not contacted by surfaces 154, 156 when the lower magnetic clip 48 is closed.

The body member 140 includes a blind cavity 166 that intersects the surface 154 and a magnet 168 installed in the cavity 166 with an interference fit. Similarly, body member 142 includes a blind cavity 170 that intersects the surface 156, a magnet 172 installed in the cavity 170, and a set screw 174 used to fix the position of the magnet 172 in the cavity 170. The lateral locations of the magnets 168, 172 on the respective surfaces 154, 156 are selected so that the magnets 168, 172 have a confronting relationship when the lower magnetic clip 48 is closed. The cavity 166 for magnet 168 is disposed between the portion 143 of hinge member 144 and the clamping surface 150 on body member 140. The cavity 170 for magnet 172 is disposed between the portion 145 of hinge member 144 and the flange 158 (and clamping surface 160) on body member 142. The magnets 168, 172 may be composed of the same materials and have the same properties and characteristics as magnets 130, 136.

The magnets 168, 172 cooperate to apply a clamping force arising from mutual magnetic attraction when brought into proximity as the body member 142 is moved relative to body member 140 to the closed position. The clamping force is transferred to the clamping surfaces 150, 160, which are separated by the thickness of a bottom edge region 40b of panel 40 and are therefore in an indirectly contacting relationship, so that the bottom edge region 40b of panel 40 is secured in a fixed position between the clamping surfaces 150, 160 and restrained against movement relative to the clamping surfaces 150, 160. The flange 158 projects outwardly from surface 156 by an amount sufficient to accommodate the hinge 144, to permit the magnets 168, 172 to mutually attract each other to provide an adequate clamping force, and to permit the clamping surfaces 140, 150 to contact.

The upper and lower magnetic clips 46, 48 of the substrate holder 50 are designed to cooperate with the frame member 52 to vertically hold panels 40 in the form of thin sheets of non-rigid (i.e., flexible) materials, such as flex-based printed circuit board materials that have a thickness in a range of 25 microns (or less) to 300 microns. Additionally, the upper and lower magnetic clips 46, 48 can also be used to hold, if desired, panels 40 composed of rigid materials in the same thickness range. The ease of operating the magnetic clips 46, 48, and in particular the upper magnetic clips 48, permits a single operator to load multiple sheets of non-rigid material into the substrate holder 50. Those of ordinary skill in the art will recognize that the number of magnetic clips 46, 48 used with the substrate holder 50 may vary depending on the specific application and desires of the user.

The clamping surface 115 has a height, $h_1$, measured from the bottom corner 115a to the stop surface 116 that is less than 0.25 inches. Similarly, the clamping surface 150 has a height, $h_2$, measured from the bottom corner 150a to the stop surface 152 that is less than 0.25 inches. These dimensions are less than the comparable dimensions for mechanical clips and are promoted by the use of the magnets 130, 136 and magnets 168, 172, which supply a strong clamping force that is applied to the opposite edge regions 40a, 40b of the panel 40. The top edge region 40a is a strip of panel material on both sides of the panel 40 and near the peripheral boundary of the panel 40 that is terminated by an edge 41a. Similarly, the bottom edge region 40b is a strip of panel material on both sides of the panel 40 and near the peripheral boundary of the panel 40 that is terminated by an edge 41b. The width of edge region 40a measured relative to edge 41a is less than or equal to height, $h_1$, and the width of edge region 40b measured relative to edge 41b is less than or equal to height, $h_2$. The edge regions 40a, 40b typically constitute keep-out zones at the perimeter of panel 40 that free of structures that could be potentially damaged by handling or contact.

In use, the substrate holder 50 is adapted to hold one or more generally planar panels 40 in the evacuable space 16 of plasma treatment system 10 as described above for interaction with the plasma such that both sides of the panels 40 are exposed in windows 94, 96 for concurrent treatment by the plasma. The substrate holder 50 may include different modes of operation depending on, for example, the thickness of the panels 40 being inserted therein.

The width of the clamping surfaces 115, 124 of the upper magnetic clip 46 and the width of the clamping surfaces 150, 160 of the lower magnetic clip 48 may be selected to be 0.25 inches, or less, which is narrower than comparable conventional mechanical clamps that require clamping surfaces of 0.5 inches or more. The magnets 130, 136 provide a clamping force to the clamping surfaces 115, 124 adequate to supply a secure engagement of each upper magnetic clip 46 with the top edge region 40a of panel 40. Similarly, the magnets 168, 172 provide a clamping force to the clamping surfaces 150, 160 adequate to supply a secure engagement of each lower magnetic clip 48 with the bottom edge region 40b of panel 40.

Figure 8:
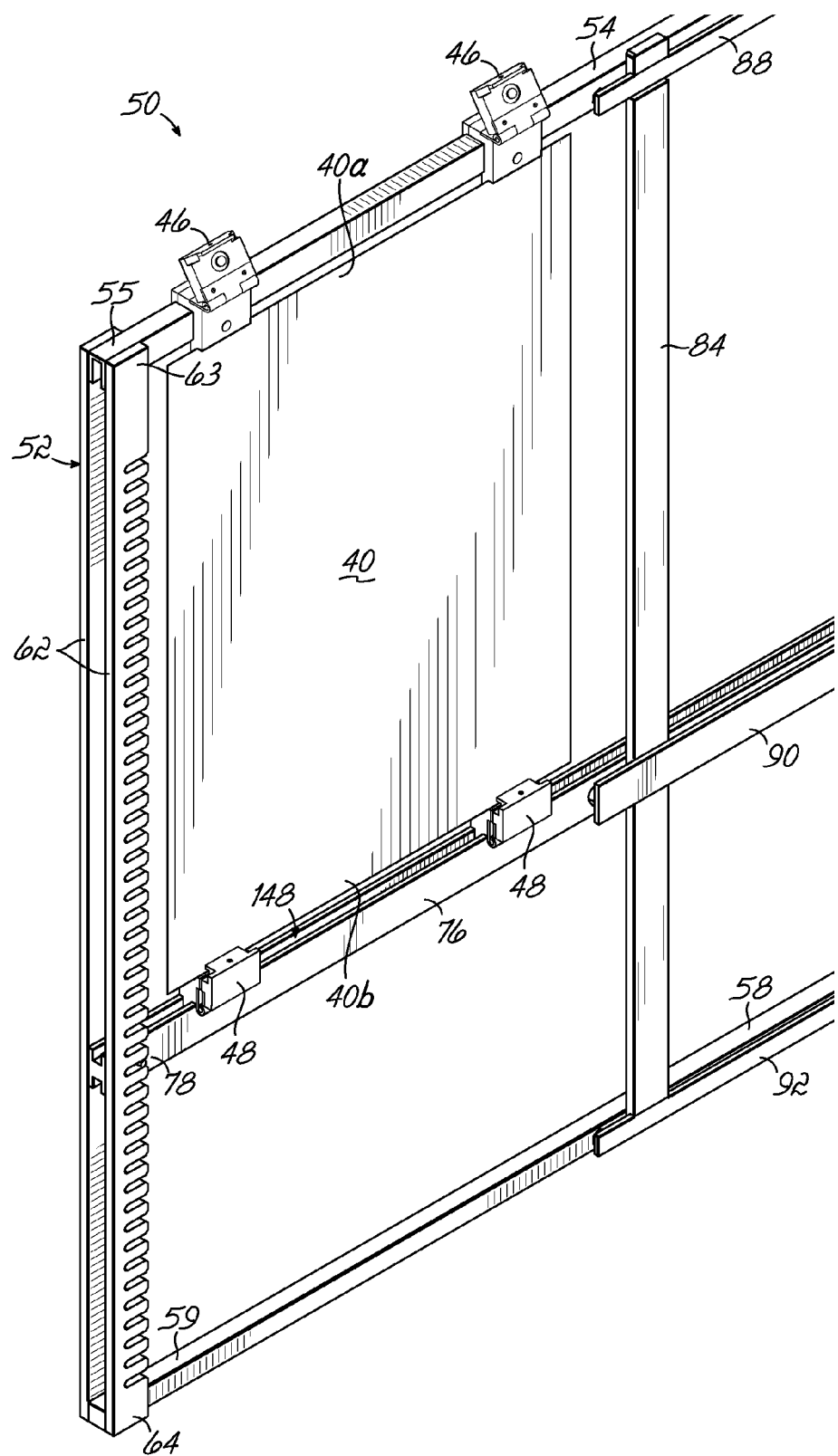
FIGS. 8 and 9 are views of a portion of the substrate holder of FIG. 3 illustrating the use of the upper and lower clips during the loading of a panel.
Figure 9:
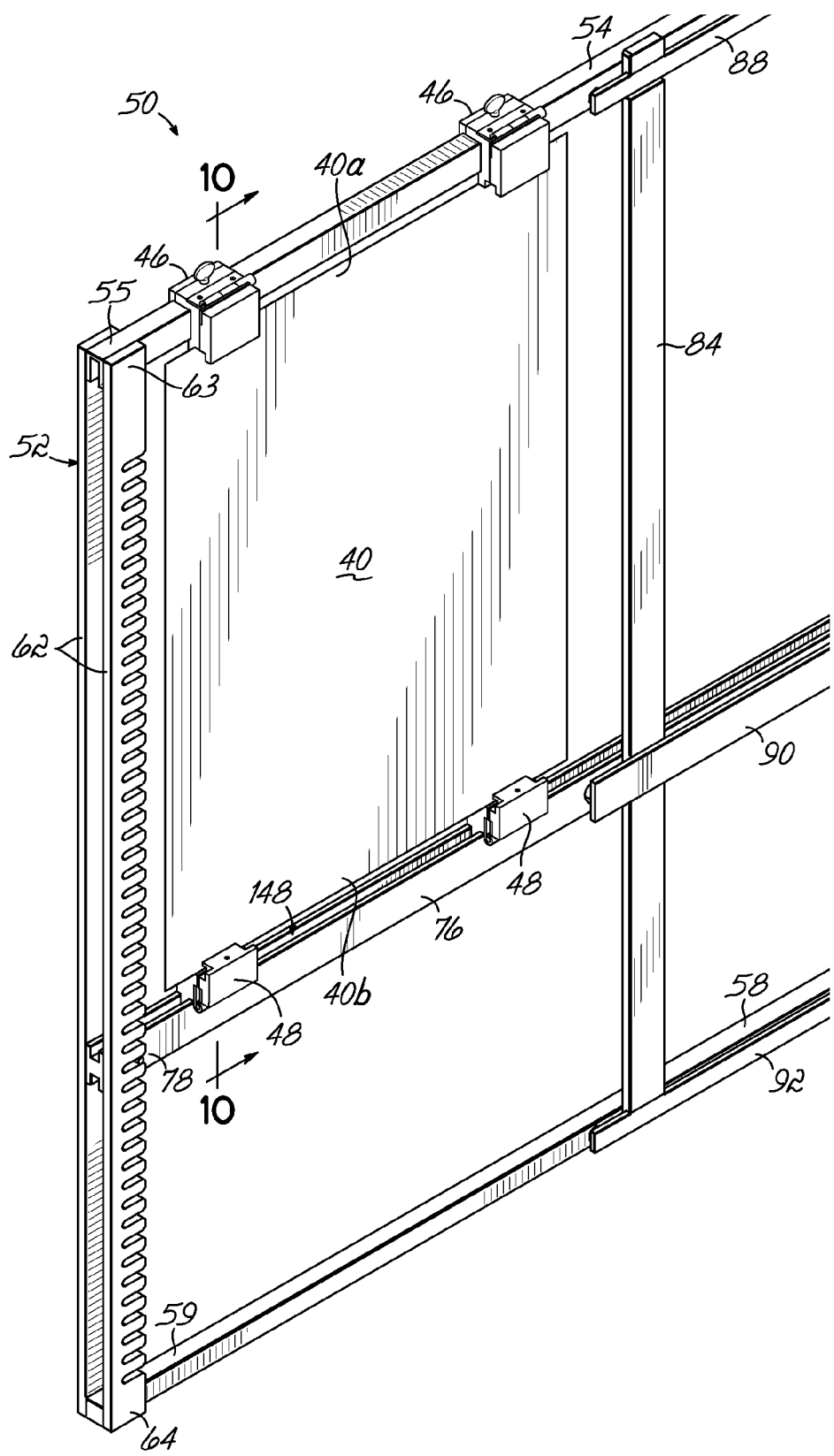

For panels 40 that are relatively thin and flexible and as shown in FIGS. 8 and 9, the substrate holder 50 and the rack 36 (FIG. 2) are initially positioned outside of the evacuable space 16 of the vacuum chamber 14. The horizontal cross beam 76 and vertical cross beam 84, as well as vertical cross beam 86, are adjusted to appropriate locations on frame member 52 based on the dimensions of the panels 40 and in the manner described above. The upper magnetic clips 46 are positioned along the length of the upper frame element 54. Each of the lower magnetic clips 48 is clamped onto the bottom edge region 40b of the panel 40 by placing the bottom edge region 40b between the clamping surfaces 150, 160 and pivoting the body member 142 to the closed position relative to hinge member 104. Stop surface 152 provides a hard stop for the bottom edge region 40b when approximated with the clamping surface 150 and the clamping surfaces 150, 160 are secured together with a clamping force from the magnets 168, 172. The mass of the lower magnetic clips 48 maintains the flexible panel 40 in a taut state. The tang 146 of each of the lower magnetic clips 46 is disposed within the U-shaped channel 148 of horizontal cross beam 76, as shown in FIG. 8. The channel 148 and tang 146 are configured dimensionally so that the tang 146 is received in the channel 148 with a clearance sufficient to permit the first body member 140 to be slideably movable relative to the horizontal cross beam 76 for positioning along the length of the channel 148.

Next, the top edge region 40a of the panel 40 is approximated with the clamping surface 115 of one of the upper magnetic clips 46. The stop surface 116 provides a limit on the positioning relative to clamping surface 115. Body member 102 is pivoted relative to body member 100 from the opened position to the closed position, as shown in FIGS. 9 and 10. Because of the construction, a single operator can hold the panel 40 with one hand and close each of the upper magnetic clips 46 with the other hand.

The upper magnetic clips 46 and lower magnetic clips 48 provide for a more positive engagement of flexible panels 40 with the substrate holder 50 in comparison with conventional mechanical clips and thus prevents or reduces the likelihood that the panels 40 will inadvertently contact the electrodes 28 during plasma treatment. Moreover, the useable surface area of each side of each panel 40 is exposed through one of the windows 94, 96 for interaction with plasma such that both sides of each panel 40 are simultaneously treated by the plasma. The clips 46, 48 do not require any type of adjustment to accommodate flexible panes of different thicknesses.

The substrate holder 50 is also well-suited for holding relatively thick and rigid panels 40 that need to receive plasma treatment. For panels 40 that are relatively thick and rigid, the substrate holder 50 may operate in a different mode. In this regard, with the substrate holder 50 and rack 36 positioned outside of the evacuable space 16 of the treatment chamber 12, the horizontal cross beam 76 and vertical cross beams 84, 86 are adjusted to appropriate locations based on the dimensions (e.g., length and width) of the panels 40 and in the manner described above. The lower magnetic clips 48 are removed from the substrate holder 50 so that the channel 148 is not occluded. The upper magnetic clips 46 can remain fastened to the upper frame element 54 as the channel 70 is not obstructed by their presence. The thick panel 40 is slid from the side edge of the substrate holder 50 between the structural elements of the side frame element 62 and into the channels 70, 148. Accordingly, the position of the relatively thick panels 40 is fixed relative to the adjacent electrodes 28 and a substantial portion of the useable surface area on each side of each panel 40 is exposed by one of the windows 94, 96 for interaction with plasma.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicants' general inventive concept. The scope of the invention itself should only be defined by the appended claims.

We claim:

1. A clip for use with a substrate holder to hold an edge region of a substrate in a plasma processing system, the clip comprising:

a first body member including a first clamping surface and a first magnet, said first body member configured to be mechanically connected with the substrate holder;

a hinge; and a second body member including a second clamping surface and a second magnet, said second body member mechanically connected by said hinge for pivotal movement relative to said first body member between a closed position in which the edge region of the substrate is positioned between said first and second clamping surfaces in a contacting relationship and an opened position in which the edge region of the substrate is released, and said second magnet configured to magnetically attract said first magnet when said second body member is in said closed position to apply a force that restrains movement of the edge region of the substrate relative to said first and second clamping surfaces.

2. The clip of claim 1 wherein said hinge has a first portion mechanically connected with said first body member and a second portion pivotally connected to said first portion, said first body member includes a first non-clamping surface between said first clamping surface and said first portion of said hinge, and said first magnet is located on said first non-clamping surface.

3. The clip of claim 2 wherein said second body member includes a second non-clamping surface between said second clamping surface and said second portion of said hinge, and said second magnet is located on said second non-clamping surface.

4. The clip of claim 3 wherein said second body member further includes a flange that projects outwardly from said second non-clamping surface, said second clamping surface is located on said flange, and said second non-clamping surface is located between said flange and said second portion of said hinge.

5. The clip of claim 2 wherein said first body member further includes a stop surface between said first non-clamping surface and said first clamping surface, said stop surface configured to contact an edge terminating the edge region of the substrate so that the edge of the substrate is blocked from extending to the first non-clamping surface when said second body member is moved from said opened position to said closed position to position the edge region of the panel between said first and second clamping surfaces.

6. The clip of claim 1 wherein said first body member includes a first non-clamping surface between said first clamping surface and said hinge and a stop surface between said first clamping surface and said first non-clamping surface, said first magnet is located on said first non-clamping surface, and said stop surface is configured to contact an edge terminating the edge region of the substrate so that the edge of the substrate is blocked from extending to the first non-clamping surface when said clip is coupled with the panel.

7. The clip of claim 6 wherein said second body member further includes a second non-clamping surface and a flange that projects outwardly from said second non-clamping surface, said second clamping surface is located on said flange, and said second magnet is located on said second non-clamping surface.

8. The clip of claim 7 wherein said second body member further includes a recess that laterally truncates said flange and said second clamping surface, said recess dimensioned and shaped to provide access for application of an opening force to said second body member to move said second body member from said closed position to said opened position.

9. A substrate holder for holding a substrate in a processing system, the substrate holder comprising:
 a frame member having a plurality of frame elements and a window for the substrate disposed peripherally inside said frame elements; and
 a clip including a first body member configured to be mechanically connective with one of said frame elements, a hinge, and a second body member pivotally connected by said hinge with said first body member, said first body member including a clamping surface and a first magnet, said second body member including a second clamping surface and a second magnet, said second body member movable relative to said first body member between a closed position in which an edge region of the substrate is positioned between said first and second clamping surfaces in a contacting relationship and an opened position in which the edge region of the substrate is released, and said second magnet is configured to magnetically attract said first magnet, when said second body member is in said closed position, to apply a force that restrains movement of the first edge region of the substrate relative to said first and second clamping surfaces.

10. The substrate holder of claim 9 wherein said first body member includes a concavity dimensioned and shaped to receive said frame element, a threaded opening extending through the body member to said concavity, and a threaded member received in said threaded opening, said threaded member including a portion that contacts said frame element and, when advanced toward said frame element, moves said first body member relative to said frame element to provide a contacting relationship between a portion of said first body member and a portion of said frame element that fixes a position of said first body member relative to said frame element.

11. The substrate holder of claim 9 wherein said first body member includes a tang, and said frame element includes a channel that is configured to receive said tang with a clearance so that said first and second body members are slideably movable for positioning along said channel.

12. The substrate holder of claim 9 wherein said hinge is configured with a range of motion such that, which said first body member is mechanically connected with said frame element, said second body member remains in said opened condition in the absence of an applied force.

13. The substrate holder of claim 12 wherein said range of motion of said second body member relative to said first body member is greater than 180°.

14. The substrate holder of claim 9 wherein said hinge has a first portion mechanically connected with said first body member and a second portion pivotally connected to said first portion, said first body member includes a first non-clamping surface between said first clamping surface and said first portion of said hinge, and said first magnet is located on said first non-clamping surface.

15. The substrate holder of claim 14 wherein said second body member includes a second non-clamping surface between said second clamping surface and said second portion of said hinge, and said second magnet is located on said second non-clamping surface.

16. The substrate holder of claim 15 wherein said second body member further includes a flange that projects outwardly from said second non-clamping surface, said second clamping surface is located on said flange, and said second non-clamping surface is located between said flange and said second portion of said hinge.

17. The substrate holder of claim 14 wherein said first body member further includes a stop surface between said first non-clamping surface and said first clamping surface, said stop surface configured to contact an edge terminating the edge region of the substrate so that the edge of the substrate is blocked from extending to the first non-clamping surface when said second body member is moved from said opened position to said closed position to position the edge region of the panel between said first and second clamping surfaces.

18. The substrate holder of claim 9 wherein said first body member includes a first non-clamping surface between said first clamping surface and said hinge and a stop surface between said first clamping surface and said first non-clamping surface, said first magnet is located on said first non-clamping surface, and said stop surface is configured to contact an edge terminating the edge region of the substrate so that the edge of the substrate is blocked from extending to the first non-clamping surface when said clip is coupled with the panel.

19. The substrate holder of claim 18 wherein said second body member further includes a second non-clamping surface and a flange that projects outwardly from said second non-clamping surface, said second clamping surface is located on said flange, and said second magnet is located on said second non-clamping surface.

20. The substrate holder of claim 19 wherein said second body member further includes a recess that laterally truncates said flange and said second clamping surface, said recess dimensioned and shaped to provide access for application of an opening force to said second body member to move said second body member from said closed position to said opened position.

* * * * *

UNITED STATES PATENT AND TRADEMARK OFFICE
CERTIFICATE OF CORRECTION

| | | |
|---|---|---|
| PATENT NO. | : 8,226,795 B2 | Page 1 of 1 |
| APPLICATION NO. | : 12/364888 | |
| DATED | : July 24, 2012 | |
| INVENTOR(S) | : William J. Brass et al. | |

It is certified that error appears in the above-identified patent and that said Letters Patent is hereby corrected as shown below:

In the Specification:

At column 3, line number 65, change "is" to --are--.

At column 5, line number 4, change "is" to --are--.

At column 6, line number 10, change "elements 54" to --member 52-- and at line number 21, change "elements 54" to --member 52-- and at line number 57, change "define" to --defines--.

At column 7, line number 36, change "relationships" to --relationship--.

At column 9, line number 39, after "that", insert --is--.

At column 11, line number 14, after "that", insert --are--.

In the Claims:

At column 14, claim number 12, line number 26, change "which" to --when--.

Signed and Sealed this
Eighteenth Day of September, 2012

David J. Kappos
*Director of the United States Patent and Trademark Office*